United States Patent
Naka et al.

(10) Patent No.: US 10,139,053 B2
(45) Date of Patent: Nov. 27, 2018

(54) SOLID-STATE LIGHT SOURCE DEVICE

(71) Applicant: Panasonic Intellectual Property Management Co., Ltd., Osaka (JP)

(72) Inventors: Nozomi Naka, Shiga (JP); Kazuhiko Yamanaka, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 201 days.

(21) Appl. No.: 14/804,162

(22) Filed: Jul. 20, 2015

(65) Prior Publication Data

US 2015/0323144 A1    Nov. 12, 2015

Related U.S. Application Data

(63) Continuation of application No. PCT/JP2014/000049, filed on Jan. 9, 2014.

(30) Foreign Application Priority Data

Jan. 24, 2013   (JP) .................. 2013-010990

(51) Int. Cl.
*F21K 9/64*     (2016.01)
*F21K 99/00*    (2016.01)
(Continued)

(52) U.S. Cl.
CPC ............... *F21K 9/56* (2013.01); *F21V 5/008* (2013.01); *F21V 9/08* (2013.01); *G02B 26/008* (2013.01);
(Continued)

(58) Field of Classification Search
CPC ......... F21V 9/16; F21V 13/12; G03B 21/204; G03B 21/206; G03B 33/12; H04N 9/3155; H04N 9/3164; H04N 9/3182; H04N 9/67
(Continued)

(56) References Cited

U.S. PATENT DOCUMENTS

2005/0012076 A1    1/2005    Morioka
2006/0152926 A1    7/2006    Hama et al.
(Continued)

FOREIGN PATENT DOCUMENTS

EP    2426716    3/2012
EP    2544048    1/2013
(Continued)

OTHER PUBLICATIONS

International Search Report of PCT application No. PCT/JP2014/000049 dated Feb. 18, 2014.

*Primary Examiner* — William Carter
(74) *Attorney, Agent, or Firm* — McDermott Will & Emery LLP

(57) ABSTRACT

A solid-state light source device is equipped with a semiconductor light emitting element and a wavelength conversion element. The semiconductor light emitting element has a first light emitter and a second light emitter. The wavelength conversion element has a first wavelength converter containing a first phosphor and has a second wavelength converter containing a second phosphor. The first wavelength converter and the second wavelength converter are disposed apart from each other. The first light emitter emits first excitation light, and the second light emitter emits second excitation light. The first phosphor converts the first
(Continued)

excitation light into first-wavelength light, and the second phosphor converts the second excitation light into second-wavelength light.

17 Claims, 15 Drawing Sheets

(51) Int. Cl.
    *G02B 27/14*    (2006.01)
    *F21V 9/08*    (2018.01)
    *F21V 5/00*    (2018.01)
    *G02B 27/28*    (2006.01)
    *G02B 26/00*    (2006.01)
    *H01S 5/40*    (2006.01)
    *G03B 21/20*    (2006.01)
    *H04N 9/31*    (2006.01)
    *H01S 5/00*    (2006.01)
    *H01S 5/323*    (2006.01)

(52) U.S. Cl.
    CPC ......... *G02B 27/141* (2013.01); *G02B 27/286* (2013.01); *G03B 21/204* (2013.01); *G03B 21/208* (2013.01); *G03B 21/2073* (2013.01); *H01S 5/4087* (2013.01); *H04N 9/3158* (2013.01); *H01S 5/005* (2013.01); *H01S 5/32341* (2013.01)

(58) Field of Classification Search
    USPC .......................................................... 362/84
    See application file for complete search history.

(56) References Cited

U.S. PATENT DOCUMENTS

| | | |
|---|---|---|
| 2009/0039375 A1 | 2/2009 | LeToquin et al. |
| 2011/0149549 A1 | 6/2011 | Miyake |
| 2011/0211333 A1 | 9/2011 | Bartlett |
| 2012/0056216 A1 | 3/2012 | Mitsuishi et al. |
| 2012/0057339 A1 | 3/2012 | Mitsuishi et al. |
| 2012/0106126 A1* | 5/2012 | Nojima ................ G02B 26/008 362/84 |
| 2012/0127435 A1 | 5/2012 | Kitano et al. |
| 2012/0300178 A1* | 11/2012 | Sugiyama ............ H04N 9/3111 353/31 |
| 2013/0010264 A1 | 1/2013 | Takahashi et al. |
| 2013/0021582 A1* | 1/2013 | Fujita .................. G03B 21/204 362/84 |
| 2013/0033651 A1* | 2/2013 | Haraguchi ........... H04N 9/3155 348/744 |
| 2014/0285774 A1* | 9/2014 | Tajiri ..................... G03B 21/28 362/235 |

FOREIGN PATENT DOCUMENTS

| | | |
|---|---|---|
| JP | 2000-031532 | 1/2000 |
| JP | 2004-071357 | 3/2004 |
| JP | 2004-107572 | 4/2004 |
| JP | 2006-173324 | 6/2006 |
| JP | 2011-129406 | 6/2011 |
| JP | 2012-098438 A | 5/2012 |
| JP | 2012-108486 | 6/2012 |
| JP | 2012-247491 | 12/2012 |
| WO | 2009/131627 | 10/2009 |
| WO | 2011/118536 | 9/2011 |

* cited by examiner

FIG. 10

| Type | Comparative example | Present exemplary embodiment |
|---|---|---|
| Color temperature Tc | 4930K | 4950K |
| General color rendering index Ra | 62 | 58 |
| Theoretical limitation of luminous efficacy (including stokes-loss) | 269 lm/W | 271 lm/W |

– 1 –

SOLID-STATE LIGHT SOURCE DEVICE

BACKGROUND OF THE INVENTION

1. Field of the Invention

The present disclosure relates to a solid-state light source device, and in more detail, to a solid-state light source device equipped with a semiconductor light emitting element and a wavelength conversion element.

2. Description of the Related Art

In recent years, there has been a demand for solid-state white light sources having a high optical output power to use as a projection light source such as a projector and an automotive headlight. Currently, a discharge lamp such as a high-luminance mercury lamp is available as a light source for the projector, and a lamp such as a halogen lamp is available as a light source for the automotive headlight. However, there are issues that, for example, service times of these devices are relatively short, or luminous efficiencies of the devices are low. To address these issues, as a light source having a high luminous efficiency, attention is being drawn to a light source using a semiconductor light emitting element such as an LED (Light Emitting Diode) and a semiconductor laser (LD: Laser Diode). For example, PTL 1 proposes a solid-state light source device which can emit white light by combining a semiconductor laser diode as a light emitting element and a wavelength converter using a phosphor. The wavelength converter of the solid-state light source device includes stacked layers containing R (Red) and G (Green) phosphors or R, G, and B (Blue) phosphors. High-luminance white light can be obtained from the light source when blue laser light or near-ultraviolet laser light enter the stacked layers.

In the following, with reference to FIG. 18A and FIG. 18B, a configuration of a conventional solid-state light source device is described. The solid-state light source device shown in FIG. 18A is configured with first excitation light source 10, wavelength conversion member 30, and light guide 20. First excitation light source 10 includes laser element 11 which emits excitation light 1 in a blue wavelength region. Wavelength conversion member 30 absorbs excitation light 1 emitted from the first excitation light source 10 and then converts a wavelength of excitation light 1. Wavelength conversion member 30 contains one or more types of phosphors which emit light in a longer wavelength region than that of excitation light 1. Light guide 20 guides excitation light 1 emitted from first excitation light source 10 and emits excitation light 1 to wavelength conversion member 30. Wavelength conversion member 30 shown in FIG. 18B is configured with stacked two layers, one of which consists of red phosphor 31b in resin and the other of which consists of green phosphor 31a in resin. This wavelength conversion member 30 is mounted on output unit 21 in FIG. 18A.

CITATION LIST

Patent Literature

PTL 1: Unexamined Japanese Patent Publication No. 2006-173324

SUMMARY OF THE INVENTION

However, the above configuration has the following problems. When excitation light 1 from a excitation light source for fluorescence enters wavelength conversion member 30, excitation light 1 is wavelength-converted in the layer which consists of green phosphor 31a in resin. This wavelength-converted light then enters the layer which consists of red phosphor 31b in resin. Therefore, the wavelength-converted light in the layer which consists of green phosphor 31a is absorbed in the layer which consists of the red phosphor 31b. As a result, the luminous efficiency problematically decreases.

An object of the present disclosure is to restrain the light having been wavelength-converted by one phosphor from being reabsorbed in other phosphors and is to obtain high luminous efficiency white light.

A solid-state light source device of the present disclosure is a solid-state light source equipped with a semiconductor light emitting element and a wavelength conversion element. The semiconductor light emitting element has a first light emitter and a second light emitter. The wavelength conversion element has a first wavelength converter containing a first phosphor and a second wavelength converter containing a second phosphor. The first wavelength converter and the second wavelength converter are disposed apart from each other. The first light emitter emits first excitation light, and the second light emitter emits second excitation light. The first phosphor converts the first excitation light into first-wavelength light, and the second phosphor converts the second excitation light into second-wavelength light.

Since the first wavelength converter and the second wavelength converter are disposed apart from each other, it is possible to restrain the first excitation light from being absorbed in the second phosphor. In addition, the second excitation light can be restrained from being absorbed in the first phosphor. As a result, a high luminous efficiency white light can be obtained.

BRIEF DESCRIPTION OF DRAWINGS

FIG. 10 is a diagram for describing the advantageous effect of the solid-state light source device of the second exemplary embodiment of the present disclosure;

DETAILED DESCRIPTION OF THE PREFERRED EMBODIMENTS

Exemplary embodiments according to the present disclosure will be described with reference to the drawings. Note that each of the exemplary embodiments to be described below is just an example, and the present disclosure is not limited to the exemplary embodiments.

First Exemplary Embodiment

In the following, a solid-state light source device in a first exemplary embodiment of the present disclosure will be described with reference to the drawings.

Figure 1:
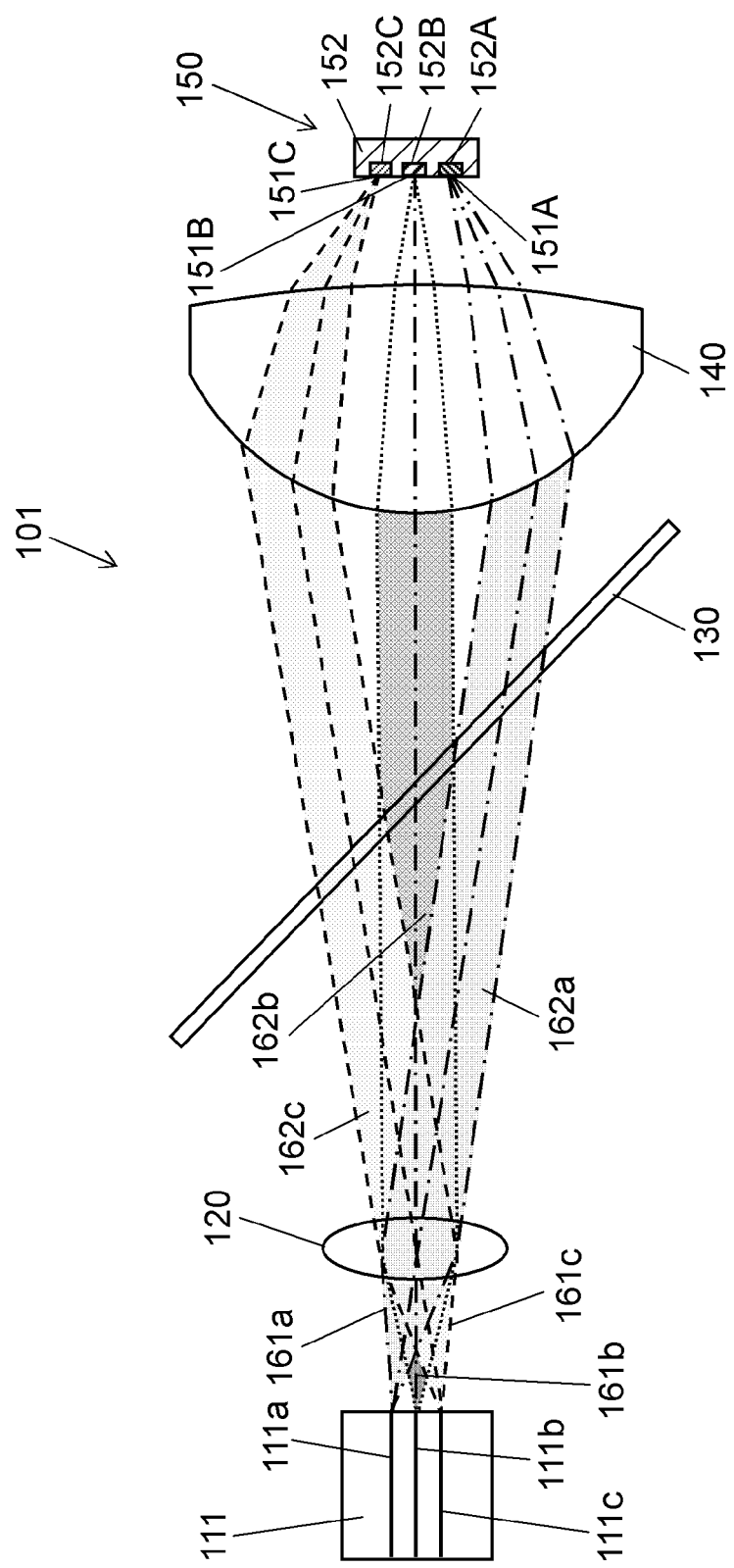
FIG. 1 is a schematic diagram for describing a configuration and an operation of a solid-state light source device of a first exemplary embodiment of the present disclosure.

As shown in FIG. 1, solid-state light source device 101 in the first exemplary embodiment is equipped with semiconductor light emitting element 111 and wavelength conversion element 150. Semiconductor light emitting element 111 has first light emitter 111a and second light emitter 111b. Wavelength conversion element 150 has first wavelength converter 151A containing a first phosphor and second wavelength converter 151B containing a second phosphor. First wavelength converter 151A and second wavelength converter 151B are disposed apart from each other. First light emitter 111a emits first excitation light 161a, and second light emitter 111b emits second excitation light 161b. The first phosphor converts first excitation light 161a into first-wavelength light 170A, and the second phosphor converts second excitation light 161b into second-wavelength light 170B.

Since first wavelength converter 151A and second wavelength converter 151B are disposed apart from each other, first excitation light 161a can be restrained from being absorbed in the second phosphor. In addition, second excitation light 161b can be restrained from being absorbed in the first phosphor. As a result, a high luminous efficiency white light can be obtained.

In the following, a more specific structure and the like is described.

<Configuration>

FIG. 1 is a diagram schematically showing a structure of solid-state light source device 101 in the first exemplary embodiment.

Semiconductor light emitting element 111 is a nitride semiconductor laser element made of nitride of, for example, group III elements (Al, Ga, and In). On semiconductor light emitting element 111, first light emitter 111a, second light emitter 111b, and third light emitter 111c are provided approximately parallel, each in a ridge stripe shape. In an emission direction of semiconductor light emitting element 111, collimator lens 120 and condenser lens 140 are disposed in this order. After collimator lens 120 converts light emitted from semiconductor light emitting element 111 into parallel light, condenser lens 140 as a first lens converges the parallel light. Wavelength conversion element 150 is disposed at a focal position of condenser lens 140.

Note that the size of the whole device of solid-state light source device 101 is about 40 mm in length, 15 mm in width, and 15 mm in height. More specifically, semiconductor light emitting element 111 has a length of about 1 mm in a resonator direction, condenser lens 140 has a pupil diameter of about 12 mm, and wavelength conversion element 150 has a square shape each side of which is about 5 mm in length.

Note that the sizes and the shapes of solid-state light source device 101, collimator lens 120, condenser lens 140, and wavelength conversion element 150 are not limited to the above example and can be appropriately modified depending on a device on which solid-state light source device 101 is to be installed.

<Semiconductor Light Emitting Element>

Semiconductor light emitting element 111 has a structure in which semiconductor layers are stacked on a substrate. Specifically, for example, semiconductor layers of nitride of group III elements (Al, Ga, and In) are stacked on the substrate, which is an n-type GaN substrate, to constitute semiconductor light emitting element 111. In the present exemplary embodiment, semiconductor light emitting element 111 is configured with the semiconductor layers stacked on a substrate in the following order: an n-type clad layer, an n-type light guide layer, an InGaN quantum well layer, a p-type light guide layer, an electron blocking layer, a p-type clad layer, and a p-type contact layer. As an n-type dopant for the nitride semiconductor, Si, Ge, and the like can be used, for example. As a p-type dopant for the nitride semiconductor, Mg and the like can be used.

First light emitter 111a, second light emitter 111b, and third light emitter 111c formed on semiconductor light emitting element 111 each have a ridge stripe structure. First light emitter 111a, second light emitter 111b, and third light emitter 111c are formed by a lift-off method, for example. Specifically, on a surface of a wafer on which semiconductor layers are stacked, an $SiO_2$ film is formed by a CVD (Chemical Vapor Deposition) or other methods after performing a pre-processing by washing with buffered hydrofluoric acid (BHF) and with water. The $SiO_2$ film is subjected to photolithography to pattern a mask having ridge stripes, and a ridge-shaped stripe structure is formed by dry etching. Therefore, intervals between a plurality of light emitters, first light emitter 111a, second light emitter 111b, and third light emitter 111c, shown in the present exemplary embodiment can be accurately controlled by the photolithography. Subsequently, on the top of the stripe structure, a p-electrode is formed by depositing metal, for example, Pd and Pt, and by patterning the metal. These first light emitter 111a, second light emitter 111b, and third light emitter 111c emit excitation light having a peak wavelength in the near-ultraviolet region.

<Collimator Lens>

As collimator lens 120, there can be used an aspherical lens or the like made of crown glass such as B270, borosilicate glass such as BK7, or other glass, for example. Then, on a surface of collimator lens 120, a dielectric multilayer film is formed as an antireflection film, in conformity with the wavelength of the light emitted from semiconductor light emitting element 111.

Note that in the present exemplary embodiment, an aspherical lens is described as an example of collimator lens 120; however, a spherical lens or a Fresnel lens other than an aspherical lens can be uses as collimator lens 120.

<Dichroic Mirror>

Dichroic mirror 130 is designed to transmit light having a wavelength of 430 nm or less and to reflect light having a wavelength of 430 nm or more, for example. Specifically, dichroic mirror 130 is designed such that films made of dielectric such as $CaF_2$, $MgF_2$, $SiO_2$, $Al_2O_3$, $ZrO_2$, and $TiO_2$ are formed in multiple layers on, for example, a white sheet glass such as B270 so that dichroic mirror 130 has predetermined transmission characteristics and reflection characteristics with respect to incident light in a 45° direction.

<Condenser Lens>

As condenser lens 140, there can be used an aspherical lens or the like made of crown glass such as B270, borosilicate glass such as BK7, or other glass, for example. The aspherical lens is set to have a high numerical aperture (NA), for example, 0.9 for radiation light. This is for the aspherical lens to efficiently take in the radiation light, which is fluorescent light radiated from the wavelength converter.

Note that, in the present exemplary embodiment, an aspherical lens is described as an example of condenser lens 140; however, a spherical lens other than an aspherical lens can be used as condenser lens 140.

<Wavelength Conversion Element>

Wavelength conversion element 150 has a configuration in which first recessed portion 152A, second recessed portion 152B, and third recessed portion 152C are provided in base 152 made of, for example, aluminum alloy material. First wavelength converter 151A is provided in first recessed portion 152A. Second wavelength converter 151B is provided in second recessed portion 152B. Third wavelength converter 151C is provided in third recessed portion 152C. These first wavelength converter 151A, second wavelength converter 151B, and third wavelength converter 151C are constituted of phosphors or the like for converting the wavelength of the light emitted from semiconductor light emitting element 111 into longer wavelengths. A specific example of first wavelength converter 151A is made such that a phosphor for converting light having a wavelength in a range from 380 nm to 430 nm into light having wavelengths in a range from 550 nm to 700 nm is mixed in binder made of organic material such as silicone and epoxy or made of inorganic material such as low melting point glass, for example. A specific example of second wavelength converter 151B is made such that a phosphor for converting light having a wavelength in a range from 380 nm to 430 nm into light having wavelengths in a range from 500 nm to 600 nm is mixed in binder. A specific example of third wavelength converter 151C is made such that a phosphor for converting light having a wavelength in a range from 380 nm to 430 nm into light having wavelengths in a range from 430 nm to 500 nm is mixed in binder. A specific example of the phosphor used for first wavelength converter 151A is a red phosphor such as an $(Sr,Ca)AlSiN_3:Eu^{2+}$. A specific example of the phosphor used for second wavelength converter 151B is green phosphor such as a $Y_3(Ga,Al)_5O_{12}:Ce^{3+}$ and a β-SiAlON. A specific example of the phosphor used for third wavelength converter 151C is a blue phosphor such as an $Si_3MgSi_2O_8:EU^{2+}$.

The above first wavelength converter 151A, second wavelength converter 151B, and third wavelength converter 151C are preferably disposed in a single circle having a diameter of 4 mm. It is more preferable that first wavelength converter 151A, second wavelength converter 151B, and third wavelength converter 151C are disposed in a single circle having a diameter of 2 mm. The clearance between first wavelength converter 151A and second wavelength converter 151B and the clearance between second wavelength converter 151B and third wavelength converter 151C depend on the arrangement of first recessed portion 152A, second recessed portion 152B, and third recessed portion 152C formed in base 152. These first recessed portion 152A, second recessed portion 152B, and third recessed portion 152C are accurately formed in base 152 by, for example, press working using a die or the like.

<Operation>

Figure 2:
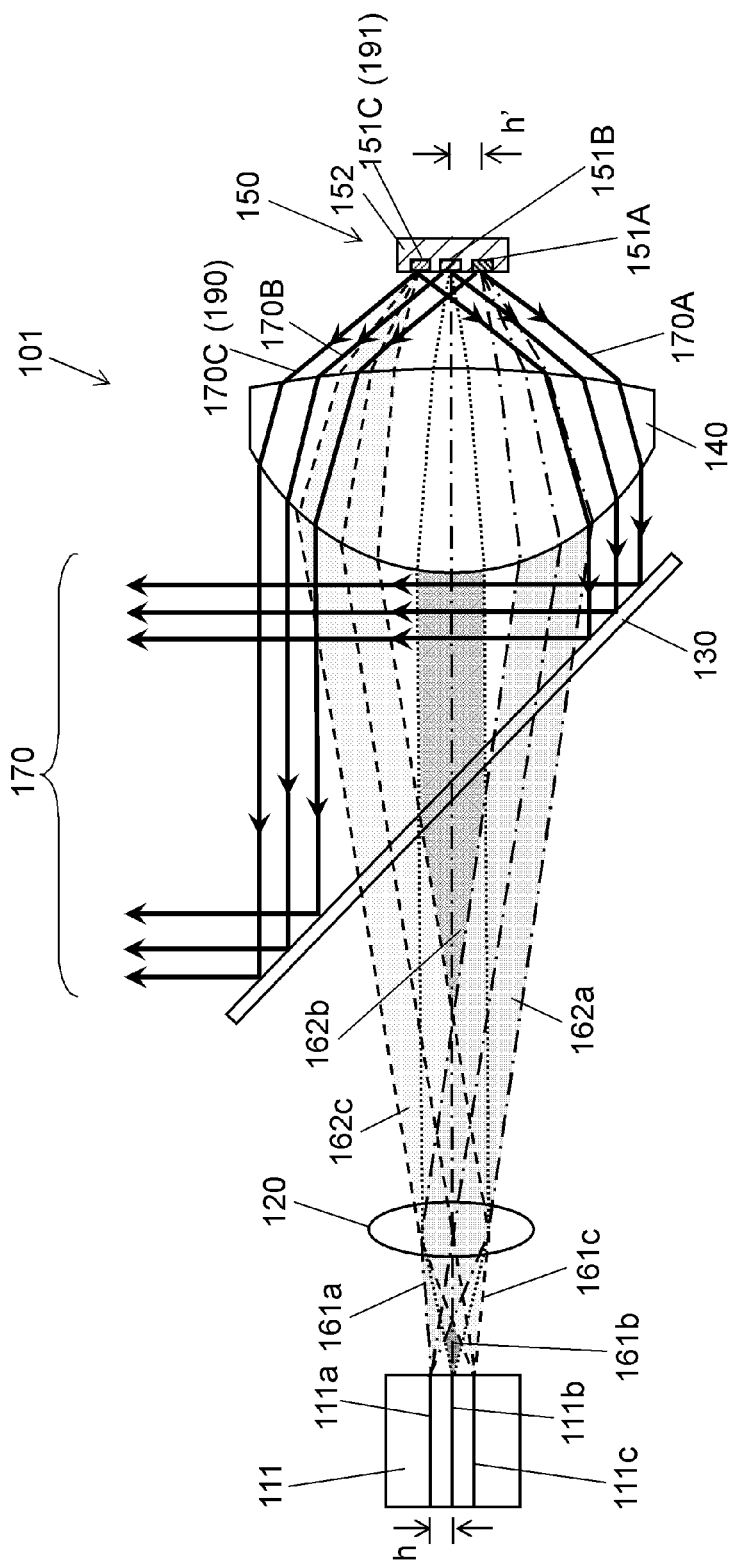
FIG. 2 is a schematic diagram for describing the operation of the solid-state light source device of the first exemplary embodiment of the present disclosure.

Subsequently, an operation of solid-state light source device 101 in the present exemplary embodiment will be described with reference to FIG. 1 to FIG. 4. From first light emitter 111a, second light emitter 111b, and third light emitter 111c of semiconductor light emitting element 111, first excitation light 161a, second excitation light 161b, and third excitation light 161c, which are, for example, laser light having a wavelength in a range from 380 nm to 430 nm in a near-ultraviolet region are respectively emitted. First excitation light 161a, second excitation light 161b, and third excitation light 161c are converted, by collimator lens 120, into first emitted light 162a, second emitted light 162b, and third emitted light 162c, which are parallel light. Then, first emitted light 162a, second emitted light 162b, and third emitted light 162c pass through dichroic mirror 130 and enter condenser lens 140. First emitted light 162a, second emitted light 162b, and third emitted light 162c are converged on wavelength conversion element 150 by condenser lens 140. First emitted light 162a enters first wavelength converter 151A. Second emitted light 162b enters second wavelength converter 151B. Third emitted light 162c enters third wavelength converter 151C. At this time, a lateral magnification β of collimator lens 120 and condenser lens 140 is designed as defined in the following equation, where the distance between first light emitter 111a and second light emitter 111b is h, and the distance between first wavelength converter 151A and second wavelength converter 151B is h', as shown in FIG. 2.

$$\beta = \frac{h'}{h}$$ [Mathematical Expression 1]

For example, when the distance between first light emitter 111a and second light emitter 111b and the distance between second light emitter 111b and third light emitter 111c are each set to be 200 μm, and the distance between first wavelength converter 151A and second wavelength converter 151B and the distance between second wavelength converter 151B and third wavelength converter 151C are each set to be 200 μm, the lateral magnification β of collimator lens 120 and condenser lens 140 is defined to be 1.

By setting the lateral magnification β of collimator lens 120 and condenser lens 140 as described above, it is easy to make first emitted light 162a enter first wavelength converter 151A, make second emitted light 162b enter second wavelength converter 151B, and make third emitted light 162c enter third wavelength converter 151C.

Further, an incident area, through which first emitted light 162a, second emitted light 162b, and third emitted light 162c enter condenser lens 140, are made sufficiently small compared with the pupil diameter of condenser lens 140. With this configuration, an incident angle of first emitted light 162a into first wavelength converter 151A can be made small; therefore, the design of the lateral magnification defined by Mathematical Expression 1 can be more arbitrarily set.

First wavelength converter 151A, second wavelength converter 151B, and third wavelength converter 151C each have a diameter of about a range from 0.2 mm to 1 mm, and the clearances between the wavelength converters are approximately in a range from 0.05 mm to 0.2 mm. First wavelength converter 151A, second wavelength converter 151B, and third wavelength converter 151C are disposed in a region, at a predetermined position on wavelength conversion element 150, having a diameter of 4 mm or less, preferably, a diameter of 2 mm or less.

A part of first emitted light 162a having entered first wavelength converter 151A is converted, by the phosphor contained in first wavelength converter 151A, into first-wavelength light 170A whose peak wavelength is in a range from 550 nm to 700 nm, and first-wavelength light 170A is emitted. A part of second emitted light 162b having entered second wavelength converter 151B is converted, by the phosphor contained in second wavelength converter 151B, into second-wavelength light 170B whose peak wavelength is in a range from 500 nm to 600 nm, and second-wavelength light 170B is emitted. A part of third emitted light 162c having entered third wavelength converter 151C is converted, by the phosphor contained in third wavelength converter 151C into third-wavelength light 170C whose peak wavelength is in a range from 430 nm to 500 nm, and third-wavelength light 170C is emitted.

First-wavelength light 170A, second-wavelength light 170B, and third-wavelength light 170C are radiation light having radiation angles in Lambertian distribution. First-wavelength light 170A, second-wavelength light 170B, and third-wavelength light 170C enter condenser lens 140 to become parallel light, are reflected by dichroic mirror 130, and are taken out. At this time, dichroic mirror 130 transmits light having a wavelength of 430 nm or less and reflects light having a wavelength of 430 nm or more. With this configuration, it is possible to efficiently take out first-wavelength light 170A, second-wavelength light 170B, and third-wavelength light 170C, which are radiation light from wavelength conversion element 150. First-wavelength light 170A, second-wavelength light 170B, and third-wavelength light 170C reflected by dichroic mirror 130 are mixed with each other to become white radiation light 170 when radiated from solid-state light source device 101. With the above configuration, it is possible to restrain first-wavelength light 170A radiated from first wavelength converter 151A from entering second wavelength converter 151B or third wavelength converter 151C. In addition, it is possible to restrain second-wavelength light 170B radiated from second wavelength converter 151B from entering first wavelength converter 151A or third wavelength converter 151C. In addition, it is possible to restrain third-wavelength light 170C radiated from third wavelength converter 151C from entering first wavelength converter 151A or second wavelength converter 151B.

<Emission Spectrum>

Subsequently, an emission spectrum of the present exemplary embodiment will be described with reference to FIG. 3 and FIG. 4.

Figure 3:
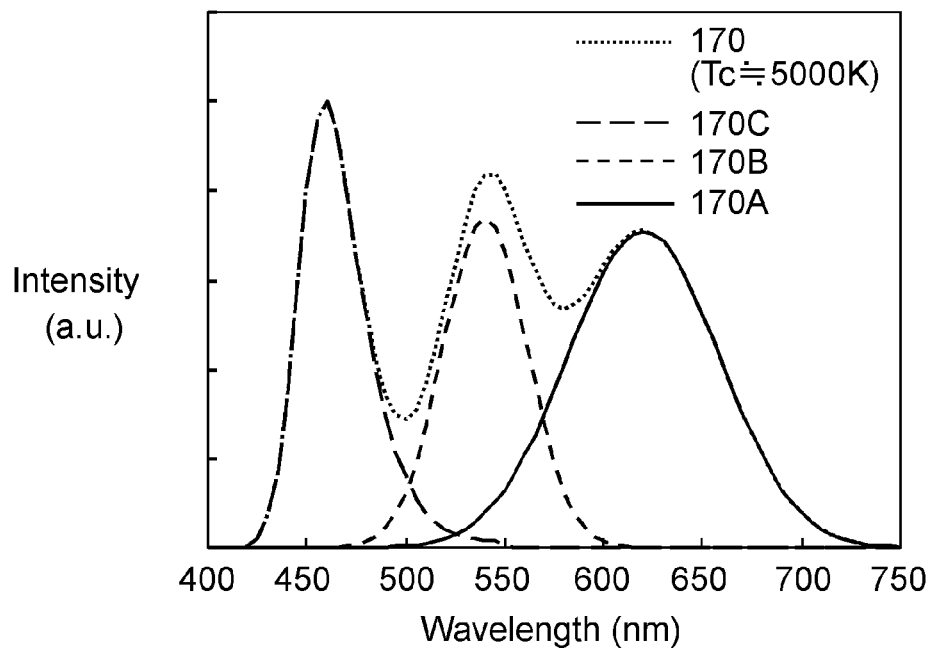
FIG. 3 is a diagram for describing an operation of the solid-state light source device of the first exemplary embodiment of the present disclosure.

As shown in FIG. 3, first-wavelength light 170A radiated from first wavelength converter 151A has a fluorescent spectrum having a peak wavelength of 620 nm and a half width of full maximum of 90 nm. Second-wavelength light 170B radiated from second wavelength converter 151B has a fluorescent spectrum having a peak wavelength of 540 nm and a half width of full maximum of 50 nm. Third wavelength converter 151C contains, as the phosphor, an $Si_3MgSi_2O_8:Eu2^+$ to radiate third-wavelength light 170C. Radiation light 170, in which first-wavelength light 170A, second-wavelength light 170B, and third-wavelength light 170C are mixed and which is emitted, is white light at 5,000 K. In the above description, first wavelength converter 151A may use, for example, a $CaAlSiN_3:Eu^{2+}$ or an $(Sr,Ca)AlSiN_3:Eu^{2+}$. Second wavelength converter 151B may use, for example, a $\beta\text{-SiAlON}:Eu^{2+}$.

Figure 4:
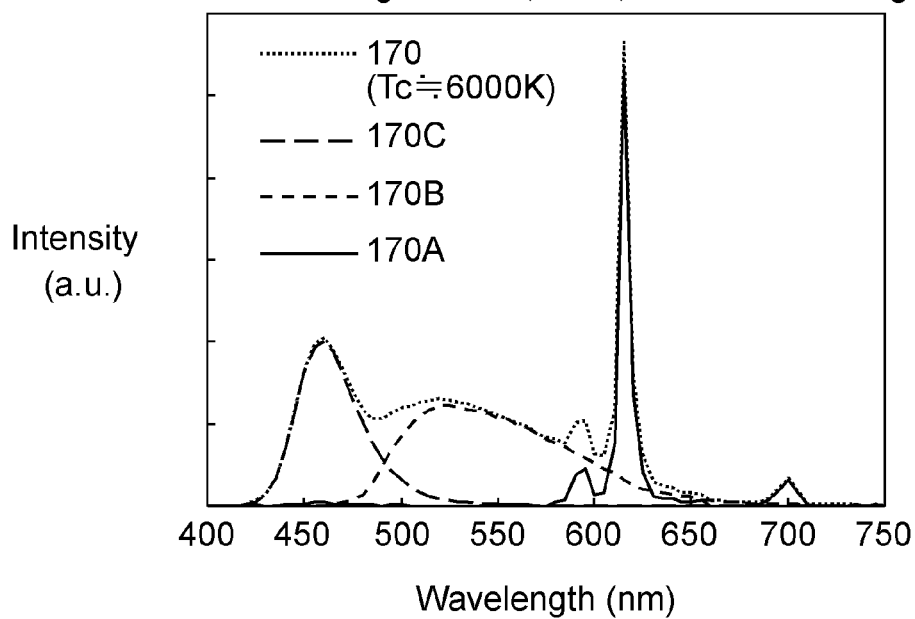
FIG. 4 is a diagram for describing an operation of the solid-state light source device of the first exemplary embodiment of the present disclosure.

With reference to FIG. 4, description will be further made on the case that different phosphor is used. With reference to FIG. 4, for first wavelength converter 151A of wavelength conversion element 150, an $LiW_2O_8:Eu^{3+}$ is used. For second wavelength converter 151B, a $Y_3(Ga,Al)_5O_{12}:Ce^{3+}$ is used. For third wavelength converter 151C, an $Si_3MgSi_2O_8:Eu^{2+}$ is used. In this configuration, light having wavelengths of 650 nm or more is barely contained in the emission spectrum of radiation light 170. Thus, when the light source is used for a device such as a display, it is possible to realize a device having a high light utilization efficiency.

<Function and Advantageous Effect>

With the configuration described above, first excitation light 161a from semiconductor light emitting element 111 enters first wavelength converter 151A. Second excitation light 161b enters second wavelength converter 151B. Third excitation light 161c enters third wavelength converter 151C. As a result, it is possible to excite the phosphors having different fluorescent spectra to emit light. Base 152 is made of aluminum alloy material, which has a high reflectance with respect to the fluorescent light radiated from first wavelength converter 151A, second wavelength converter 151B, and third wavelength converter 151C. First wavelength converter 151A is disposed in first recessed portion 152A formed in base 152. Second wavelength converter 151B is disposed in second recessed portion 152B formed in base 152. Third wavelength converter 151C is disposed in third recessed portion 152C formed in base 152. Therefore, for example, first-wavelength light 170A radiated from first wavelength converter 151A does not enter second wavelength converter 151B or third wavelength converter 151C. Thus, it is possible to restrain first-wavelength light 170A from being absorbed in the phosphors contained in second wavelength converter 151B and third wavelength converter 151C. In addition, it is possible to restrain second-wavelength light 170B from being absorbed in the phosphor contained in first wavelength converter 151A and third wavelength converter 151C. As a result, it is possible to efficiently take out the radiation light from the phosphor in first wavelength converter 151A and the radiation light from the phosphor in second wavelength converter 151B; thus radiation light 170 can be radiated as high luminous efficiency white light.

In addition, since a semiconductor laser is used for semiconductor light emitting element 111, it is possible to increase an amount of light entering minute first wavelength converter 151A, second wavelength converter 151B, and third wavelength converter 151C. That is because laser light has directivity. Therefore, it is possible to more efficiently excite the phosphor than in the case that an LED is used as an excitation light source. Further, since a semiconductor laser having a plurality of light emission points is used for semiconductor light emitting element 111, it is possible to adjust intervals between the light emission points of semiconductor light emitting element 111 by using a mask patterning process of a semiconductor process. It is also possible to reduce the number of components of the optical elements. Therefore, it is easier to align optical axes of the required optical elements than in the case of a large number of optical elements being used. In addition, since the fluorescent light is radiated from minute first wavelength converter 151A, second wavelength converter 151B, and third wavelength converter 151C, it is easy to obtain, by using a lens or the like, fluorescent emission light such as white light which has a high rectilinearity and has a high coupling efficiency to an optical system on the subsequent stage. In general, as light output is higher, laser characteristics are affected more by heat, and total electrical-to-optical power efficiency (wall-plug efficiency) thus decreases. However, by increasing the number of stripes, an operation point per stripe can be low; thus, it is possible to provide a laser light source having high total electrical-to-optical power efficiency and high optical power output.

Modified Example

Figure 5:
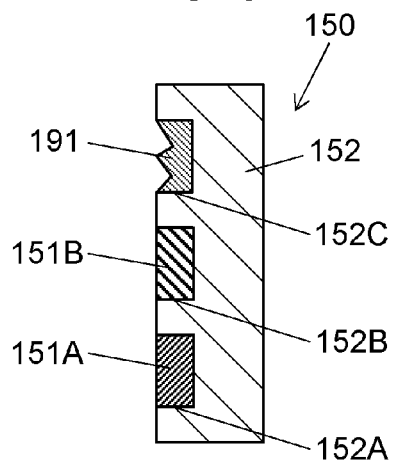
FIG. 5 is a diagram for describing a configuration of a modified example of the solid-state light source device of the first exemplary embodiment of the present disclosure.

Subsequently, a modified example of the first exemplary embodiment will be described with reference to FIG. 5 and FIG. 6. In the present modified example, semiconductor light emitting element 111 is a nitride semiconductor laser element which radiates emitted light having a central wavelength in a range from 430 nm to 480 nm. Wavelength conversion element 150 is equipped with first wavelength converter 151A, second wavelength converter 151B, and polarization converter 191. Polarization converter 191 is made such that high reflectance particles, such as titanium oxide, are dispersed in binder such as low melting point glass. On a surface of a side, of polarization converter 191, on which third emitted light 162c is received, there are formed projections and recessions which are bigger than the wavelength of third emitted light 162c. Dichroic mirror 130 is set to have a transmittance whose value varies depending on a polarization direction at the wavelength of third emitted light 162c.

A specific operation will be described with reference to FIG. 2 and FIG. 6. First light emitter 111a, second light emitter 111b, and third light emitter 111c of semiconductor light emitting element 111 radiate first emitted light 162a, second emitted light 162b, and third emitted light 162c which are laser light having a central wavelength of 445 nm. At this time, first emitted light 162a, second emitted light 162b, and third emitted light 162c are polarized light having an electric field component in a direction parallel to the surface on which first light emitter 111a, second light emitter 111b, and third light emitter 111c are formed. First emitted light 162a passes through dichroic mirror 130 and enters first wavelength converter 151A. Second emitted light 162b passes through dichroic mirror 130 and enters second wavelength converter 151B. First wavelength converter 151A radiates first-wavelength light 170A which has a fluorescent spectrum having a peak in a wavelength range from 550 nm to 700 nm. Second wavelength converter 151B radiates second-wavelength light 170B which has a fluorescent spectrum having a peak in a wavelength range from 500 nm to 600 nm. The fluorescent spectrum of first-wavelength light 170A and the fluorescent spectrum of second-wavelength light 170B are different. Third emitted light 162c enters polarization converter 191 and becomes fourth emitted light 190, a polarization direction of which has been changed or which is non-polarized light, and is reflected by polarization converter 191. Therefore, a part of or the entire of fourth emitted light 190 is reflected by dichroic mirror 130 and is radiated as light constituting white radiation light 170 from solid-state light source device 101.

Figure 6:
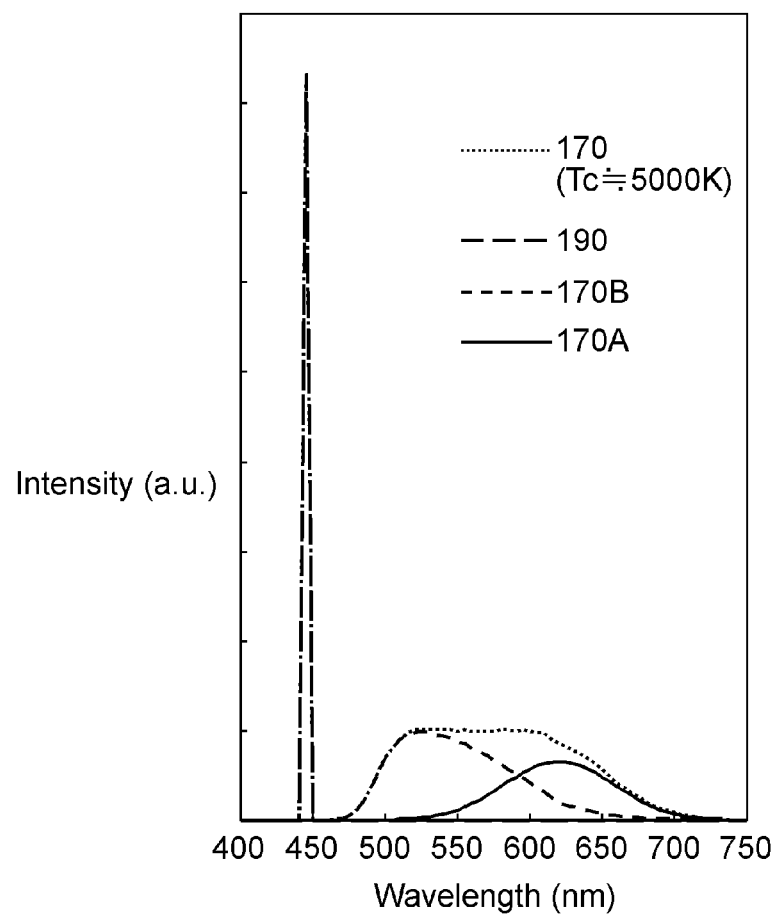
FIG. 6 is a diagram for describing an operation of the modified example of the solid-state light source device of the first exemplary embodiment of the present disclosure.

An example of the emission spectrum of the above white radiation light 170 is shown in FIG. 6. Here, first-wavelength light 170A is light radiated from an $(Sr,Ca)AlSiN_3$:$Eu^{2+}$. Second-wavelength light 170B is light radiated from a $Y_3(Ga,Al)_5O_{12}$:$Ce^{3+}$. White radiation light 170, which is mixed light of first-wavelength light 170A, second-wavelength light 170B, and fourth emitted light 190, is set to have a correlated color temperature of approximately 5,000 K.

By using the above configuration, first-wavelength light 170A radiated from first wavelength converter 151A is prevented from entering second wavelength converter 151B. In addition, it is possible to restrain second-wavelength light 170B radiated from second wavelength converter 151B from entering first wavelength converter 151A. In addition, it is possible to restrain fourth emitted light 190 reflected by polarization converter 191 from entering first wavelength converter 151A and second wavelength converter 151B. Therefore, first-wavelength light 170A can be restrained from being absorbed in second wavelength converter 151B. In addition, second-wavelength light 170B can be restrained from being absorbed in first wavelength converter 151A. In addition, fourth emitted light 190 can be restrained from being absorbed in first wavelength converter 151A and second wavelength converter 151B. As a result, the white light can be efficiently radiated from solid-state light source device. First-wavelength light 170A, second-wavelength light 170B, and fourth emitted light 190 are radiated from very small regions being close to each other. Therefore, a coupling efficiency to the optical system can be high, and an efficient solid-state light source device can thus be realized.

Second Exemplary Embodiment

In the following, solid-state light source device 201 in a second exemplary embodiment of the present disclosure will be described with reference to FIG. 7 to FIG. 11. Regarding solid-state light source device 201 of the present exemplary embodiment, description will be made only on parts which are different from solid-state light source device 101 of the first exemplary embodiment.

Figure 7:
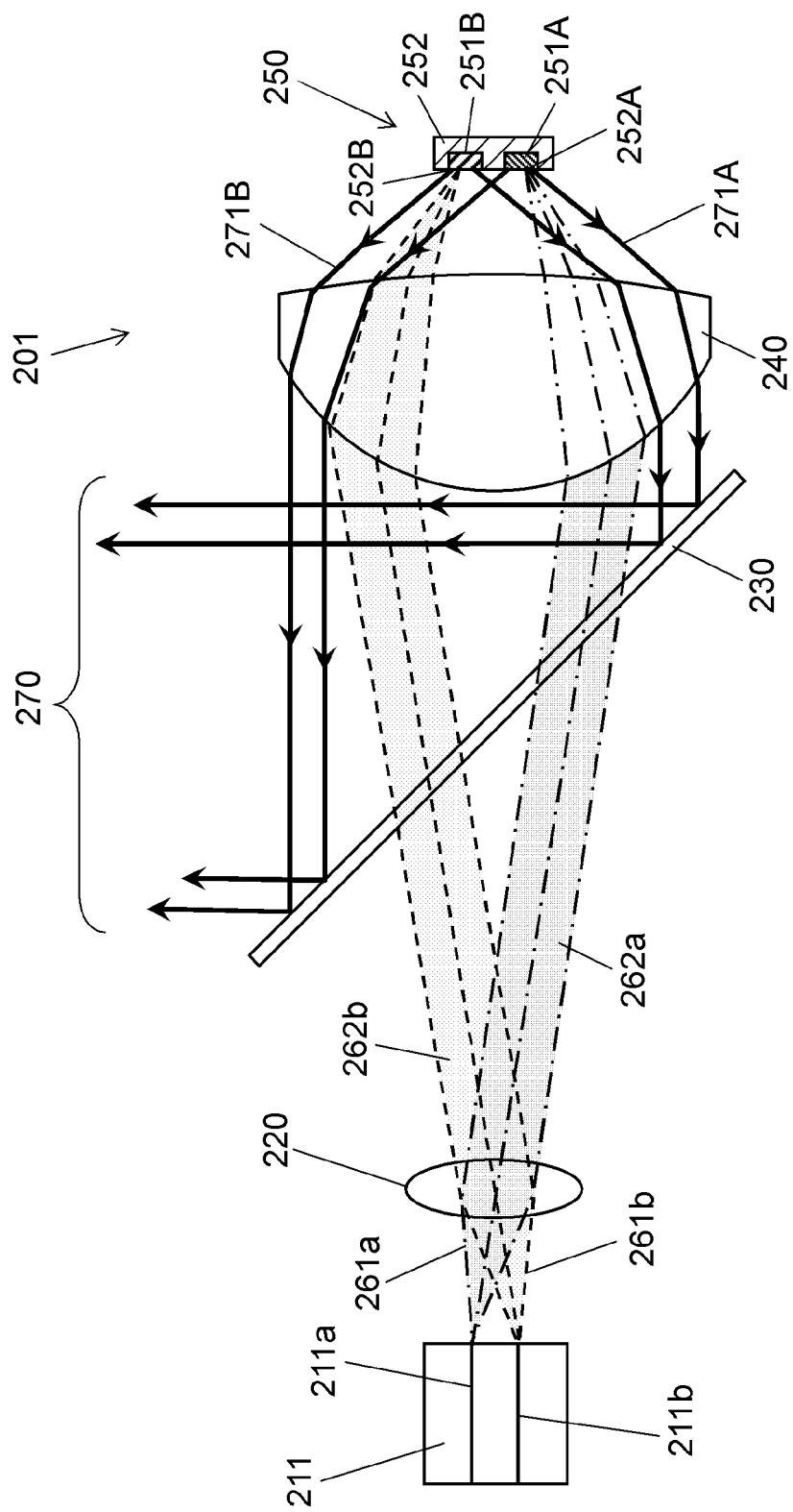
FIG. 7 is a schematic diagram for describing a configuration and an operation of a solid-state light source device of a second exemplary embodiment of the present disclosure.

FIG. 7 is a diagram showing a structure of solid-state light source device 201 in the second exemplary embodiment. In the present exemplary embodiment, a light emitter of semiconductor light emitting element 211 has two light emitters of first light emitter 211a and second light emitter 211b; and wavelength conversion element 250 has two wavelength converters of first wavelength converter 251A and second wavelength converter 251B. The above configuration is different from the configuration of the first exemplary embodiment.

Two light emitters of first light emitter 211a and second light emitter 211b having, for example, ridge stripe shapes are provided on semiconductor light emitting element 211. First excitation light 261a and second excitation light 261b emitted from first light emitter 211a and second light emitter 211b are converted by collimator lens 220 into first emitted light 262a and second emitted light 262b, which are parallel light. First emitted light 262a and second emitted light 262b pass through dichroic mirror 230 and enter condenser lens 240 as a first lens. First emitted light 262a and second emitted light 262b enter a vicinity of a central portion of a pupil of condenser lens 240 to be converged and are made to enter wavelength conversion element 250.

Here, dichroic mirror 230 has a glass plate and a dielectric multilayer film thereon. The dielectric multilayer film transmits light having a wavelength 430 nm or less and reflects light having a wavelength of 430 nm or more, for example, with respect to light entering from a 45° direction.

Wavelength conversion element 250 has two recessed portions of first recessed portion 252A and second recessed portion 252B formed in base 252 configure with, for example, an aluminum alloy substrate. In first recessed portion 252A, there is embedded first wavelength converter 251A containing a phosphor. In second recessed portion 252B, there is embedded a second wavelength converter 251B containing a phosphor. The phosphor of first wavelength converter 251A and the phosphor of second wavelength converter 251B are different from each other. The phosphor constituting first wavelength converter 251A is preferably, for example, a so-called yellow phosphor having a fluorescent peak in a wavelength range from 540 nm to 610 nm. Specific examples of the yellow phosphor, include a $Sr_3SiO_5:Eu^{2+}$, a $(Ba,Sr)Si_2O_2N_2:Eu^{2+}$, a $(Ba,Sr)Si_2(O,Cl)_2N_2:Eu^{2+}$, a $SrSi_2(O,Cl)_2N_2:Eu^{2+}$, and a $(Ca_{1-x}Sr_x)_7(SiO_3)_6Cl_2:Eu^{2+}$. The phosphor constituting second wavelength converter 251B is preferably, for example, a so-called blue phosphor having a fluorescent peak in a wavelength range from 430 nm to 520 nm. Specific examples of the blue phosphor include an $Si_3MgSi_2O_8:Eu^{2+}$, a $BaMgAl_{10}O_{17}:Eu^{2+}$, and an $(Sr,Ca,Ba,Mg)_{10}(PO_4)_6Cl_2:Eu^{2+}$.

It is possible to highly precisely adjust an incident position at which first emitted light 262a enters first wavelength converter 251A, by adjusting an optical magnification of collimator lens 220 and condenser lens 240. It is possible to highly precisely adjust an incident position at which second emitted light 262b enters second wavelength converter 251B, by adjusting the optical magnification collimator lens 220 and condenser lens 240. Thus, for example, first-wavelength light 271A, which is the yellow light radiated from first wavelength converter 251A and second-wavelength light 271B, which is the blue light radiated from second wavelength converter 251B, are taken in by condenser lens 240, are reflected by dichroic mirror 230, and are radiated as white radiation light 270 from solid-state light source device 201.

<Function and Advantageous Effect>

In the above configuration, it is possible to make first excitation light 261a emitted from semiconductor light emitting element 211 enter first wavelength converter 251A with a high positional accuracy. In addition, it is possible to make second excitation light 261b enter second wavelength converter 251B with a high positional accuracy. In the above example, first wavelength converter 251A is constituted of a yellow phosphor and second wavelength converter 251B is constituted of a blue phosphor. In this way, when the phosphor used for first wavelength converter 251A and the phosphor used for second wavelength converter 251B are constituted of different phosphors, it is possible to control the color temperature, spectrum, and the like of radiation light 270. Base 252 constituting wavelength conversion element 250 is made of a material such as aluminum alloy material which reflects visible light. First wavelength converter 251A is embedded in first recessed portion 252A. Second wavelength converter 251B is embedded in second recessed portion 252B. Thus, second-wavelength light 271B radiated from second wavelength converter 251B, for example, is not absorbed in the phosphor contained in first wavelength converter 251A. That is, it is possible to prevent the two different phosphors from absorbing the radiation light each other and to suppress deterioration of the luminous efficiency. As a result, since the radiation light from the phosphor of second wavelength converter 251B is efficiently taken out, it is possible to emit radiation light 270, which is high luminous efficiency white light.

Figure 8:
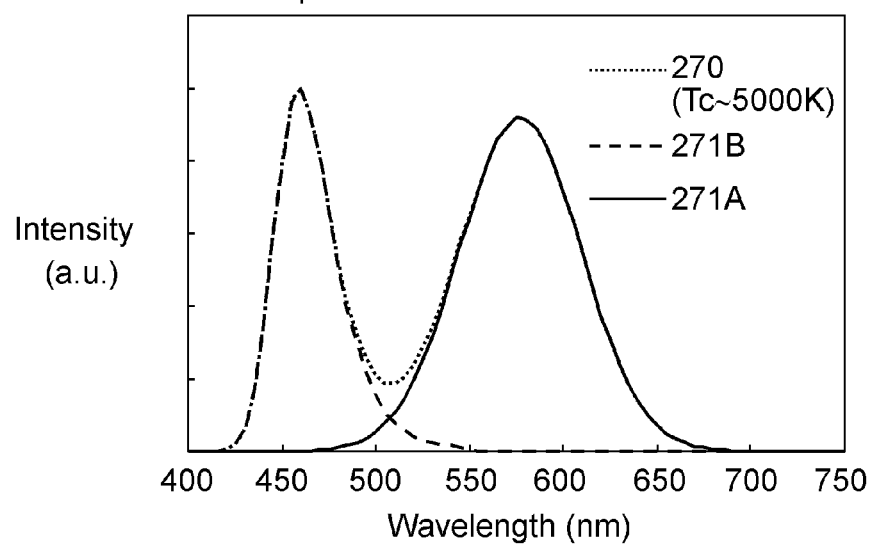
FIG. 8 is a diagram for describing the operation of the solid-state light source device of the second exemplary embodiment of the present disclosure.

The above advantageous effect will be more specifically described with reference to FIG. 8 to FIG. 11. FIG. 8 is a diagram showing wavelength dependencies of light intensity of first-wavelength light 271A, second-wavelength light 271B, and radiation light 270, which is white light at a color temperature of 5,000 K. The conditions used for FIG. 8 are that the excitation light is laser light having a wavelength of 405 nm, that a yellow phosphor which emits fluorescent light having a peak wavelength of fluorescence of 577 nm and a spectrum half-value width of 75 nm is used for first wavelength converter 251A, and that an $Si_3MgSi_2O_8:Eu^{2+}$ is used as the phosphor constituting second wavelength converter 251B. In the above conditions, specific examples of the yellow phosphor include an $Sr_3SiO_5:Eu^{2+}$, a $(Ba,Sr)Si_2O_2N_2:Eu^{2+}$, a $(Ba,Sr)Si_2(O,Cl)_2N_2:Eu^{2+}$, an $SrSi_2(O,Cl)_2N_2:Eu^{2+}$, and the like.

Figure 9:
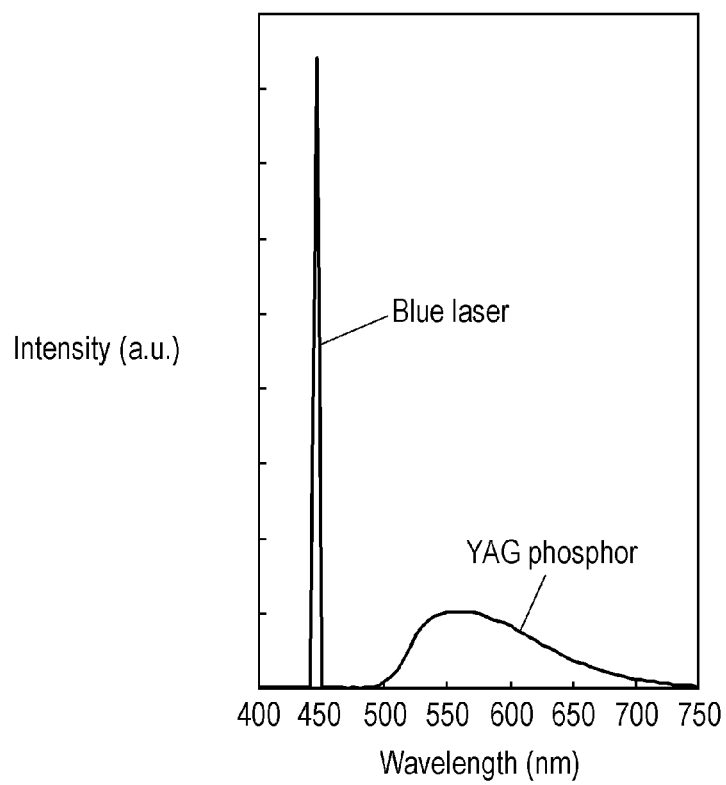
FIG. 9 is a diagram for describing a comparative example for describing an advantageous effect of the solid-state light source device of the second exemplary embodiment of the present disclosure.
Figure 11:
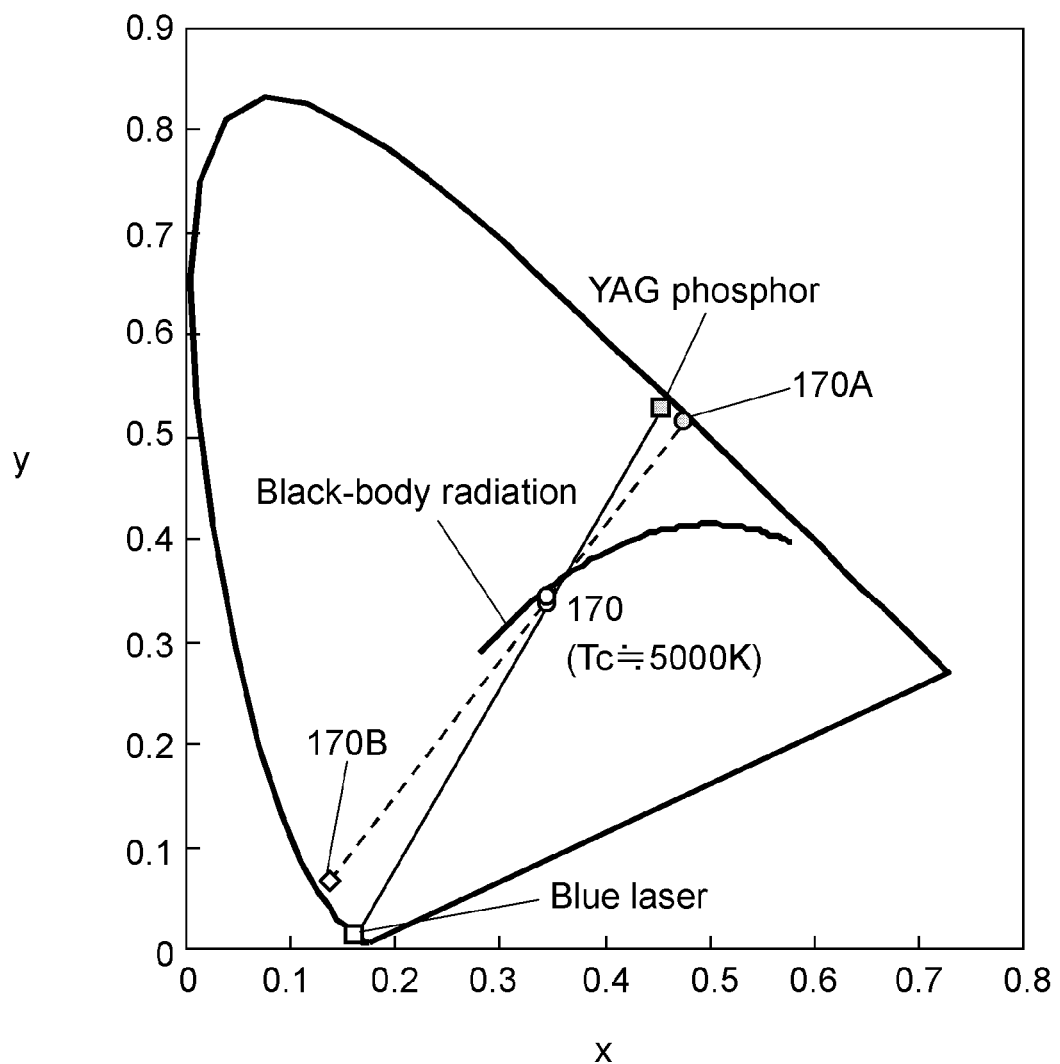
FIG. 11 is a diagram for describing the advantageous effect of the solid-state light source device of the second exemplary embodiment of the present disclosure.

In order to compare with the above configuration, there is shown in FIG. 9 an emission spectrum of a solid-state light source device as a comparative example, where the solid-state light source device is constituted of a laser light having a wavelength of 445 nm and a YAG ($Y_3Al_5O_{12}:Ce^{3+}$). FIG. 10 shows a result of comparison of characteristics with respect to the spectra shown in FIG. 8 designed based on the configuration of the present exemplary embodiment and the spectrum of the comparative example shown in FIG. 9. When color temperatures Tc and general color rendering indexes Ra are set almost the same, theoretical limitations of luminous efficiency considering Stokes loss of the two can be almost the same value of 270 lm/W. This shows that since the fluorescent light is not reabsorbed in the yellow phosphor or the blue phosphor in the configuration shown in the present exemplary embodiment, it is possible to realize the luminous efficiency which is equivalent to the luminous efficiency in the case of a single phosphor being used. Further, as shown in a chromaticity coordinate shown in FIG. 11, by using the solid-state light source device having the above configuration, a chromaticity coordinate similar to black-body radiation can be shown even if an intensity ratio of the blue light to the yellow light is deviated. Further, as can be understood from the comparison between FIG. 8 and FIG. 9, since the white light of the present exemplary embodiment has a broad spectrum in a blue region, it is possible to radiate white light having a low speckle noise and thus has low stimulation to eye.

Although, in the above configuration, an example is described in which, in order to obtain white light, first wavelength converter 251A is constituted of the yellow phosphor, and second wavelength converter 251B is constituted of the blue phosphor, it may be possible that first wavelength converter 251A is constituted of a blue-green phosphor and that second wavelength converter 251B is constituted of an orange phosphor. In this case, regarding the phosphors, an Eu-activated $BaZrSi_3O_9$ can be used for the blue-green light, and an Eu-activated $Sr_3SiO_5$ and an Eu activated α-SiAlON can be used for orange light, for example.

Third Exemplary Embodiment

In the following, solid-state light source device 301 in a third exemplary embodiment of the present disclosure will be described with reference to FIG. 12. Regarding the solid-state light source device of the present exemplary embodiment, description will be made only on parts which are different from the solid-state light source device of the first exemplary embodiment.

Figure 12:
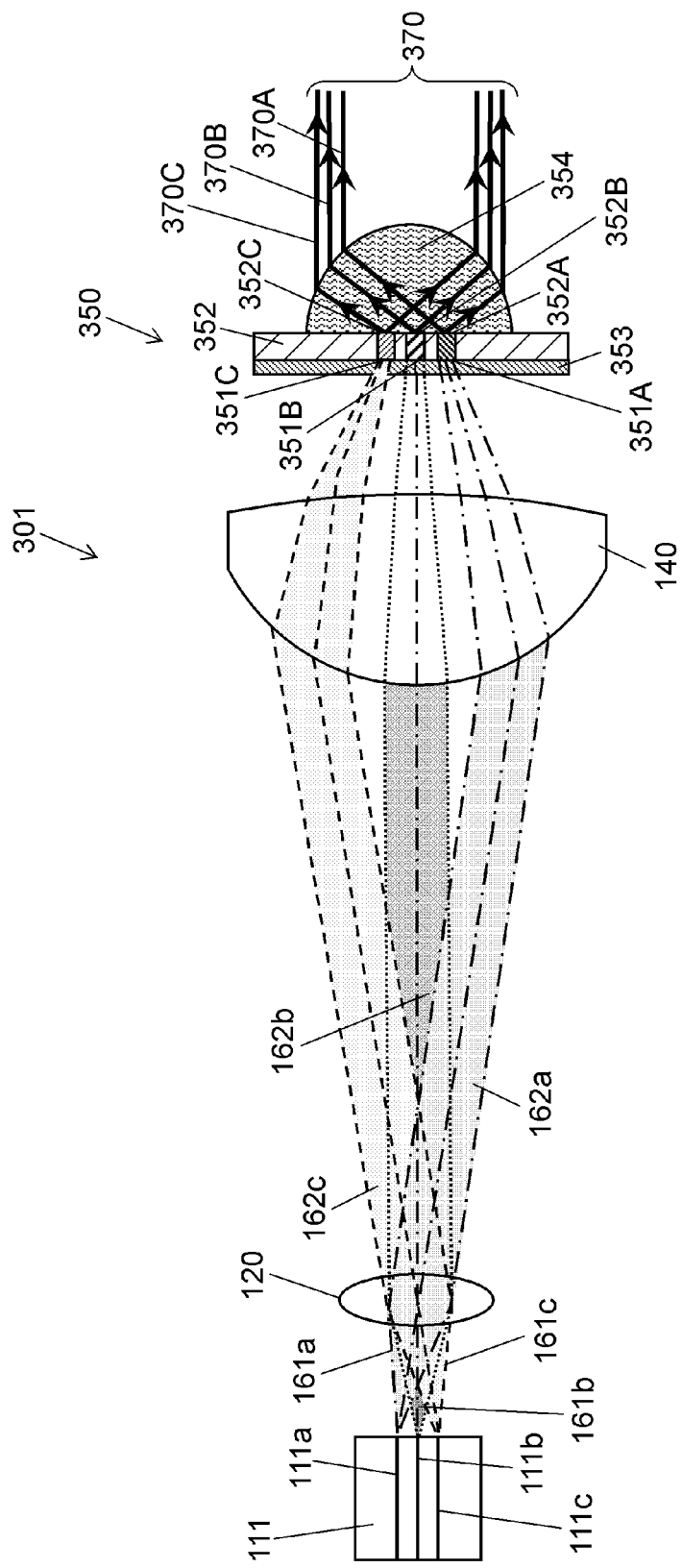
FIG. 12 is a schematic diagram for describing a configuration and an operation of a solid-state light source device of a third exemplary embodiment of the present disclosure.

FIG. 12 is a diagram showing a structure of solid-state light source device 301 in the third exemplary embodiment. In solid-state light source device 301 of the present exemplary embodiment, wavelength conversion element 350 is different from the wavelength conversion element of the solid-state light source device of the first exemplary embodiment.

Wavelength conversion element 350 has base 352 constituted of, for example, an aluminum alloy plate and has first through hole 352A, second through hole 352B, and third through hole 352C on base 352. In first through hole 352A, first wavelength converter 351A having phosphor having a peak wavelength of fluorescence in a wavelength range from 550 nm to 700 nm is embedded. In second through hole 352B, second wavelength converter 351B having phosphor having a peak wavelength of fluorescence in a wavelength range from 500 nm to 600 nm is embedded. In third through hole 352C, third wavelength converter 351C having phosphor having a peak wavelength of fluorescence in a wavelength range from 430 nm to 500 nm is embedded. The peak wavelength of fluorescence of first wavelength converter 351A, the peak wavelength of fluorescence of second wavelength converter 351B, and the peak wavelength of fluorescence of third wavelength converter 351C are different from each other. Here, first wavelength converter 351A, second wavelength converter 351B, and third wavelength converter 351C are configured such that phosphor is mixed and buried in binder such as organic transparent material such as silicone and inorganic transparent material such as low melting point glass. On one side surface of base 352 of wavelength conversion element 350, dichroic mirror 353 is disposed in contact. Dichroic mirror 353 has a glass on which there is formed a dielectric multilayer film which transmits light having a wavelength of 430 nm or less and reflects light having a wavelength of 430 nm or more. Lens 354 is disposed on the other surface so as to be contact with each other. Lens 354 is constituted of a transparent glass having a radius of curvature which is sufficiently larger than an area in which first wavelength converter 351A, second wavelength converter 351B, and third wavelength converter 351C are configured.

In solid-state light source device 301 of the above configuration, first excitation light 161a, second excitation light 161b, and third excitation light 161c, which are, for example, laser light having a wavelength in a range from 380 nm to 430 nm are respectively emitted from first light emitter 111a, second light emitter 111b, and third light emitter 111c of semiconductor light emitting element 111. First excitation light 161a, second excitation light 161b, and third excitation light 161c are converted by collimator lens 120 into first emitted light 162a, second emitted light 162b, and third emitted light 162c, which are parallel light. First emitted light 162a, second emitted light 162b, and third emitted light 162c are converged by condenser lens 140 and enter wavelength conversion element 350. First emitted light 162a, second emitted light 162b, and third emitted light 162c pass through dichroic mirror 353 and respectively enter first wavelength converter 351A, second wavelength converter 351B, and third wavelength converter 351C. First wavelength converter 351A converts first emitted light 162a into first-wavelength light 370A, which is red light, for example. Second wavelength converter 351B converts second emitted light 162b into second-wavelength light 370B, which is green light, for example. Third wavelength converter 351C converts third emitted light 162c into third-wavelength light 370C, which is blue light, for example. First-wavelength light 370A, second-wavelength light 370B, and third-wavelength light 370C are radiated in all directions. First-wavelength light 370A, second-wavelength light 370B, and third-wavelength light 370C are reflected to be directed toward lens 354 by dichroic mirror 353 and a side wall, of base 352, having first through hole 352A, second through hole 352B, and third through hole 352C. First-wavelength light 370A, second-wavelength light 370B, and third-wavelength light 370C radiated from the lens 354 side of wavelength conversion element 350 become, by way of lens 354, white radiation light 370, which is approximate to parallel light, and are radiated out of solid-state light source device 301.

<Function and Advantageous Effect>

With the configuration described above, it is possible to make the light emitted from first light emitter 111a, second light emitter 111b, and third light emitter 111c of semiconductor light emitting element 111 accurately enter first wavelength converter 351A, second wavelength converter 351B, and third wavelength converter 351C disposed at different positions in a minute area. First-wavelength light 370A radiated from first wavelength converter 351A is radiated from solid-state light source device 301 without entering second wavelength converter 351B or third wavelength converter 351C. Second-wavelength light 370B radiated from second wavelength converter 351B is radiated from solid-state light source device 301 without entering first wavelength converter 351A or third wavelength converter 351C. Third-wavelength light 370C radiated from third wavelength converter 351C is radiated from solid-state light source device 301 without entering first wavelength converter 351A or second wavelength converter 351B.

Thus, it is possible to prevent first-wavelength light 370A from being absorbed in second wavelength converter 351B and third wavelength converter 351C. In addition, it is possible to prevent second-wavelength light 370B from being absorbed in first wavelength converter 351A and third wavelength converter 351C. In addition, it is possible to prevent third-wavelength light 370C from being absorbed in first wavelength converter 351A and second wavelength converter 351B. As a result, the efficiency of solid-state light source device 301 can be improved. First-wavelength light 370A, second-wavelength light 370B, and third-wavelength light 370C are radiated from such a minute area as first wavelength converter 351A, second wavelength converter 351B, and third wavelength converter 351C. As a result, with radiation light 370, it is possible to obtain white light which has a high luminous efficiency and has a high coupling efficiency to an optical system disposed on the subsequent stage. Further, radiation light 370 enters lens 354 directly from first wavelength converter 351A, second wavelength converter 351B, and third wavelength converter 351C and is taken out to the outside; thus, light loss is smaller than in the case that the light is taken out by way of dichroic mirror 130 of the first exemplary embodiment.

Fourth Exemplary Embodiment

In the following, solid-state light source device 401 in a fourth exemplary embodiment of the present disclosure will be described with reference to FIG. 13 and FIG. 14. Regarding the solid-state light source device of the present exemplary embodiment, description will be made only on parts which are different from the solid-state light source device of the first exemplary embodiment.

Figure 13:
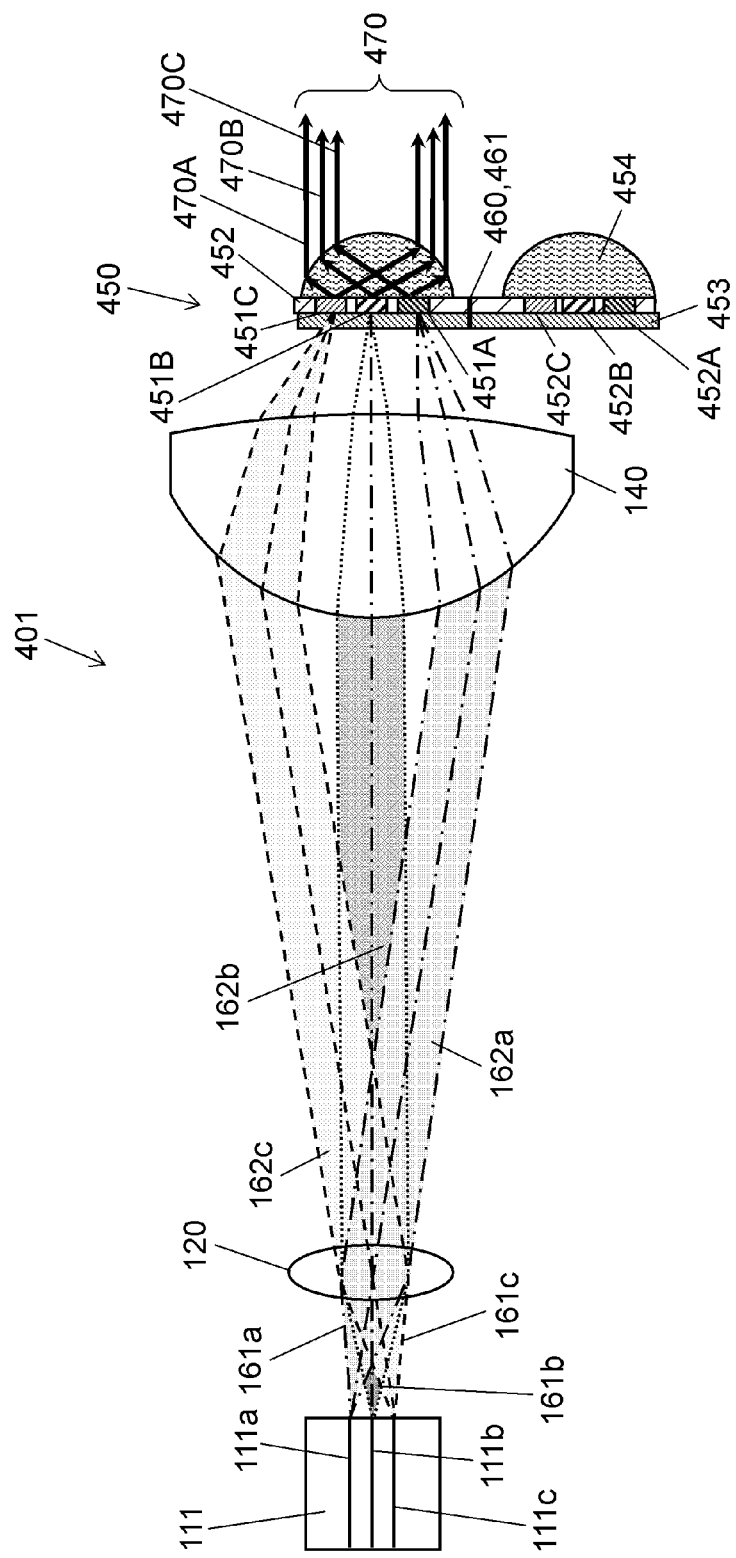
FIG. 13 is a schematic diagram for describing a configuration and an operation of a solid-state light source device of a fourth exemplary embodiment of the present disclosure.
Figure 14:
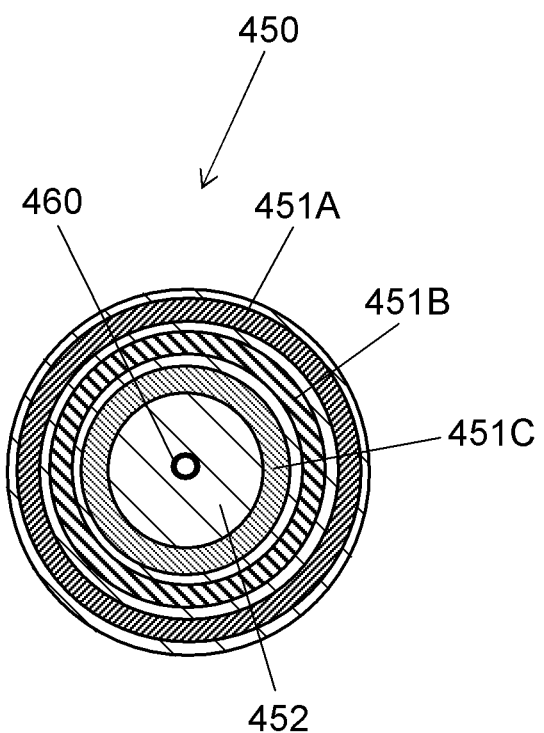
FIG. 14 is a diagram for describing the configuration of the solid-state light source device of the fourth exemplary embodiment of the present disclosure.

FIGS. 13 and 14 are diagrams showing a structure of solid-state light source device 401 in the fourth exemplary embodiment.

Wavelength conversion element 450 has, for example, fourth through hole 461 formed at a center of base 452 made of, for example, an aluminum alloy plate, and has rotation shaft 460 provided in fourth through hole 461. Further, on a surface of a side, of wavelength conversion element 450, not facing semiconductor light emitting element 111, there is disposed lens 454 having a radius of curvature which is sufficiently larger than an area in which first wavelength converter 451A, second wavelength converter 451B, and third wavelength converter 451C are configured. Lens 454 is made of transparent glass. Lens 454 is in contact with first wavelength converter 451A, second wavelength converter 451B, and third wavelength converter 451C.

From first light emitter 111a, second light emitter 111b, and third light emitter 111c of semiconductor light emitting element 111, there are respectively emitted first excitation light 161a, second excitation light 161b, and third excitation light 161c, which are, for example, laser light having a wavelength in a range from 380 nm to 430 nm. First excitation light 161a, second excitation light 161b, and third excitation light 161c are converted by collimator lens 120 into first emitted light 162a, second emitted light 162b, and third emitted light 162c, which are parallel light. First emitted light 162a, second emitted light 162b, and third emitted light 162c are converged by condenser lens 140 and enter wavelength conversion element 450. At this time, wavelength conversion element 450 rotates about rotation shaft 460.

First wavelength converter 451A converts first emitted light 162a into first-wavelength light 470A, which is, for example, red light. Second wavelength converter 451B converts second emitted light 162b into second-wavelength light 470B, which is, for example, green light. Third wavelength converter 451C converts third emitted light 162c into third-wavelength light 470C, which is, for example, blue light.

<Function and Advantageous Effect>

With the configuration described above, it is possible to prevent first wavelength converter 451A, second wavelength converter 451B, and third wavelength converter 451C from generating heat due to absorbing the light emitted from semiconductor light emitting element 111, and it is thus possible to suppress deterioration of the luminance due to the heat of first wavelength converter 451A, second wavelength converter 451B, and third wavelength converter 451C.

It is preferable to set T1 and R1 to meet the following relationship, where the longest afterglow time of the phosphors contained in first wavelength converter 451A, second wavelength converter 451B, and third wavelength converter 451C is T1 (sec), and a rotation speed per second of the wavelength conversion element is R1, for example.

$$R1 > 1/T1$$ [Mathematical Expression 2]

The above configuration keeps brightness of radiation light 470.

Fifth Exemplary Embodiment

Subsequently, solid-state light source device 501 in a fifth exemplary embodiment of the present disclosure will be described with reference to FIG. 15. Regarding the solid-state light source device of the present exemplary embodiment, description will be made only on parts which are different from the solid-state light source device of the fourth exemplary embodiment.

Figure 15:
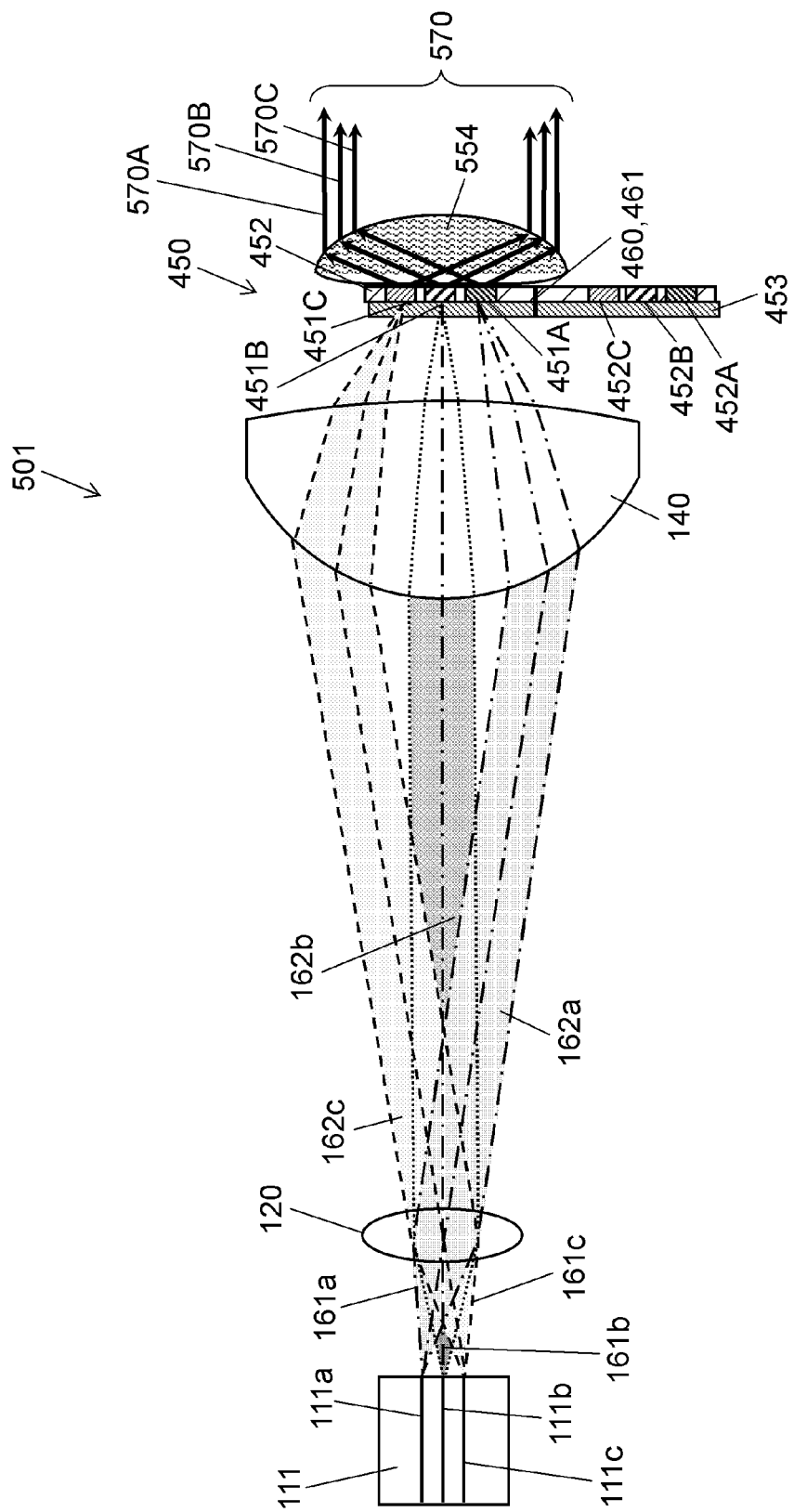
FIG. 15 is a schematic diagram for describing a configuration and an operation of a solid-state light source device of a fifth exemplary embodiment of the present disclosure.

FIG. 15 is a diagram showing a structure of solid-state light source device 501 in the fifth exemplary embodiment. Solid-state light source device 501 of the present exemplary embodiment is different in that lens 554 is not fixed on the wavelength conversion element.

First wavelength converter 451A converts first emitted light 162a into first-wavelength light 570A, which is red light, for example. Second wavelength converter 451B converts second emitted light 162b into second-wavelength light 570B, which is green light, for example. Third wavelength converter 451C converts third emitted light 162c into third-wavelength light 570C, which is blue light, for example.

First-wavelength light 570A, second-wavelength light 570B, and third-wavelength light 570C enter lens 554 which is spatially apart, and are taken out as white emitted light 570.

<Function and Advantageous Effect>

With the configuration described above, lens 554 can utilize the white light in a wider region as emitted light 570. Since lens 554 is spatially apart from wavelength conversion element 450, lens 554 can have a radius of curvature which is sufficiently larger than first wavelength converter 451A, second wavelength converter 451B, and third wavelength converter 451C. Therefore, coupling efficiency can be high.

Sixth Exemplary Embodiment

Subsequently, solid-state light source device 601 in a sixth exemplary embodiment of the present disclosure will be described with reference to FIG. 16. Regarding a configuration of solid-state light source device 601 of the present exemplary embodiment, description will be made only on parts different from second exemplary embodiment.

Figure 16:
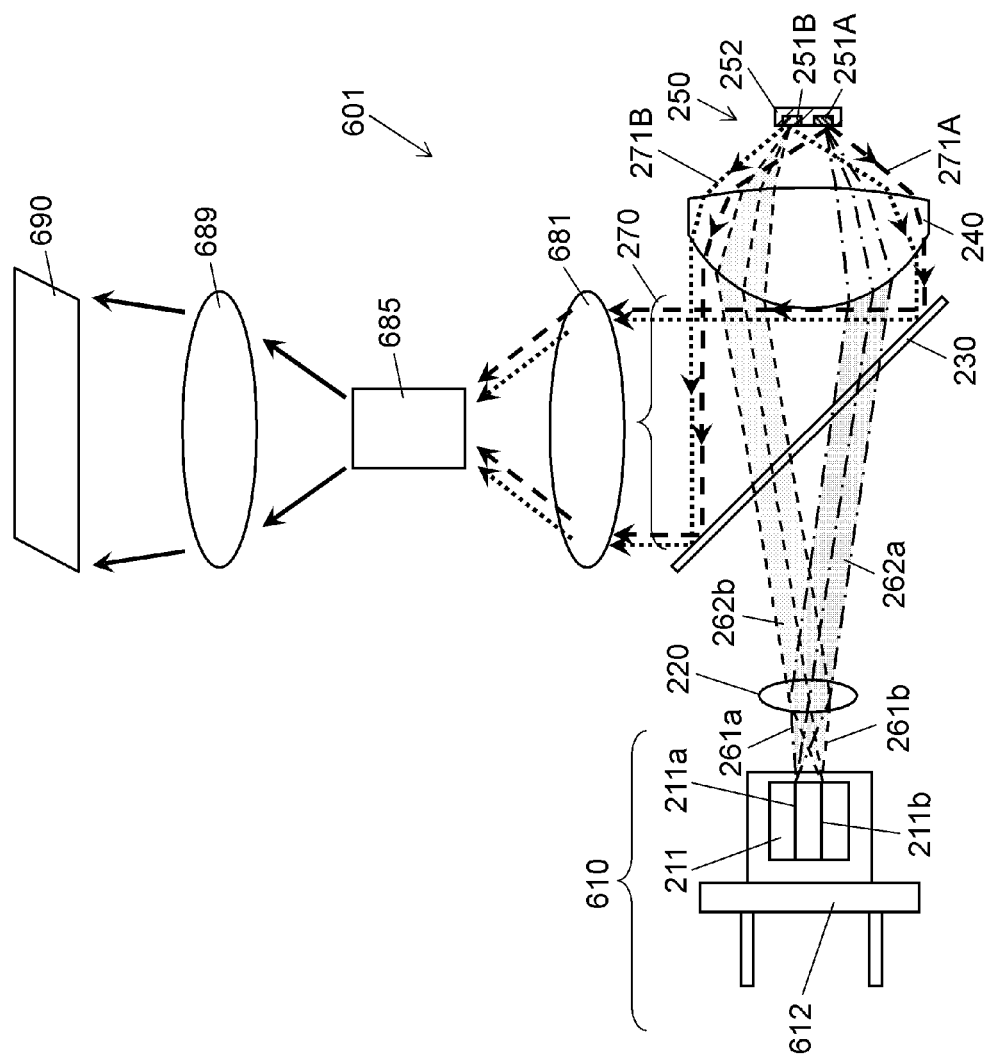
FIG. 16 is a schematic diagram for describing a configuration and an operation of a solid-state light source device of a sixth exemplary embodiment of the present disclosure.

FIG. 16 is a diagram showing solid-state light source device 601 in the sixth exemplary embodiment. FIG. 16 illustrates in more detail the portion of semiconductor light emitting device 610 and an optical system for the light which is radiated from dichroic mirror 230.

Semiconductor light emitting device 610 has semiconductor light emitting element 211 of the second exemplary embodiment mounted on, for example, package 612, which is called CAN type. Specifically, semiconductor light emitting element 211 is mounted on package 612 via a submount (not shown) and is further hermetic sealed with a can cap having a glass window (not shown).

The optical system for light which is radiated from dichroic mirror 230 has condenser lens 681, rod lens 685, and projection lens 689. Radiation light 270 emitted from dichroic mirror 230 is collected by condenser lens 681 and enters rod lens 685. The light emitted from rod lens 685 becomes projected light 690 by being enlarged by projection lens 689 and irradiates an object (not shown).

<Function and Advantageous Effect>

With the configuration described above, it is possible to convert a projection image of radiation light 270 into an arbitrary shape depending on a cross-sectional shape of rod lens 685. For example, if rod lens 685 is formed in a quadrangular cylinder shape, a rectangular projection image is obtained. If rod lens 685 is formed in a hexagonal cylinder shape, a hexagonal projection image is obtained. If rod lens 685 is formed in a circular cylinder shape, a circular projection image is obtained. In addition, due to multiple reflection in rod lens 685, it is possible to uniformly mix, in projected light 690, the light having different spectra constituting first-wavelength light 271A and second-wavelength light 271B. Further, projection lens 689 can be appropriately selected to adjust brightness, size, and the like of projected light 690.

Note that the above configuration can be applied not only to the second exemplary embodiment but also to the solid-state light source device of the first and third to fifth exemplary embodiments.

In the first to sixth exemplary embodiments described above, aluminum alloy is used as the material constituting bases 152, 252, 352, and 452 of wavelength conversion elements 150, 250, 350, and 450; however, the material is not limited to aluminum alloy. As a material for constituting bases 152, 252, 352, and 452, it is preferable to use a material having high thermal conductivity. The reason is to discharge heat generated in the phosphors constituting first wavelength converters 151A, 251A, 351A, and 451A, second wavelength converters 151B, 251B, 351B, and 451B, and third wavelength converters 151C, 351C, and 451C. In addition, it is preferable to use a material which reflects visible light radiated from first wavelength converters 151A, 251A, and 351A, second wavelength converters 151B, 251B, and 351B, and third wavelength converters 151C and 351C. For example, copper whose surface is plated with silver may be used.

In the above first exemplary embodiment, it is more preferable that outer shapes of first wavelength converter 151A, second wavelength converter 151B, and third wavelength converter 151C each fit in a circle with a diameter of 1 mm. This is because with this configuration, each of the light converted by first wavelength converter 151A, second wavelength converter 151B, and third wavelength converter 151C is substantially identical to a point light source so that coupling efficiency to an optical system can be high.

In the first exemplary embodiment, the shapes of first wavelength converter 151A, second wavelength converter 151B, and third wavelength converter 151C are not limited to a circle, but may be a square or a rectangular, or may be a regular polygon such as a regular triangle and a regular hexagon. Further, the shapes of first wavelength converter 151A, second wavelength converter 151B, and third wavelength converter 151C are not limited to a regular polygon, but may be other polygons, or can be a shape surrounded by a closed curved line such as an ellipse.

Further, wavelength conversion element 150 may be formed of orthogonal matrixes each of which is constituted of a plurality of each of first wavelength converter 151A, second wavelength converter 151B, and third wavelength converter 151C.

Such a shape and arrangement of first wavelength converters 151A, second wavelength converters 151B, and third wavelength converters 151C can be applied to the wavelength conversion element according to the second, third, and sixth exemplary embodiments.

In the above first to fourth exemplary embodiments, as a material for converting light from semiconductor light emitting elements 111 and 211 into light having a wavelength in a range from 430 nm to 500 nm, the following phosphors can be used: an Eu activated $Sr_3MgSi_2O_8$, an Eu activated $(Sr,Ca,Ba)_3MgSi_2O_8$, an Eu activated $(Sr,Ca)_3MgSi_2O_8$, an Eu activated $(Sr,Ba)_3MgSi_2O_8$, an Eu activated $(Sr,Ca,Ba)_2MgSi_2O_7$, an Eu activated $(Sr,Ca)_2MgSi_2O_7$, an Eu activated $(Sr,Ba)_2MgSi_2O_7$, an Eu activated $BaMgAl_{10}O_{17}$, and the like.

As a material for converting light from the semiconductor light emitting element into light having a wavelength in a range from 500 nm to 650 nm, there can be used a Ce activated $Y_3(Al,Ga)_5O_{12}$, a Ce activated $Y_3Al_5O_{12}$, an Eu activated β-SiAlON, an Eu activated α-SiAlON, and the like.

In addition, as a material for converting light from semiconductor light emitting elements 111 and 211 into light having a wavelength in a range from 550 nm to 700 nm, there can be used Eu activated CaAlSiN,Eu activated (Sr, Ca)AlSiN, Eu activated $LiW_2O_8$, Eu.Sm activated $La_2W_3O_{12}$, and the like.

In the above configuration, as activated material, it is possible to use not only a Ce activated substance and an Eu activated substance but also a Mn activated substance. The above phosphors may be used with an europium concentration or a manganese concentration being optimized.

Figure 17:
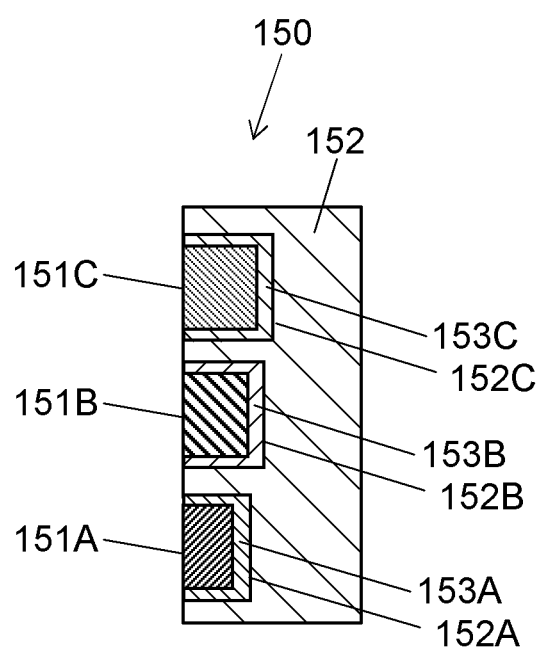
FIG. 17 is a diagram for describing a configuration of a modified example of the solid-state light source devices of the first to sixth exemplary embodiments of the present disclosure.
Figure 18A:
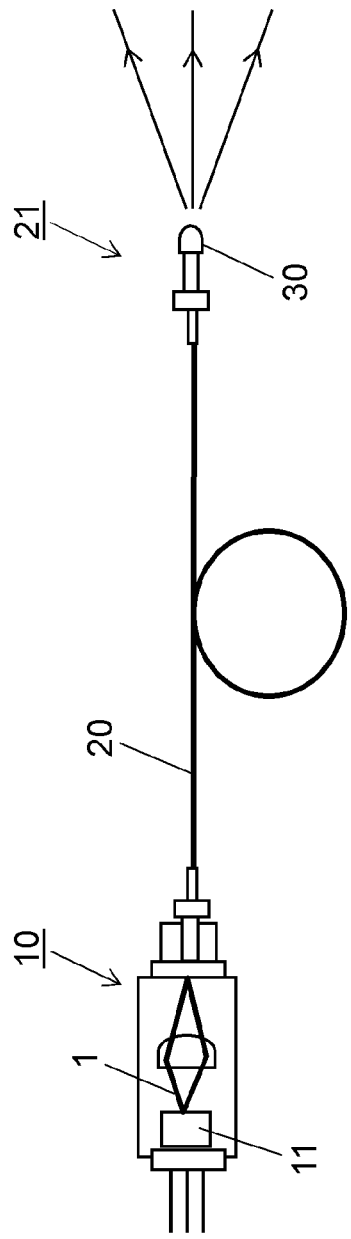
FIG. 18A is a diagram for describing a configuration of a conventional solid-state light source device.
Figure 18B:
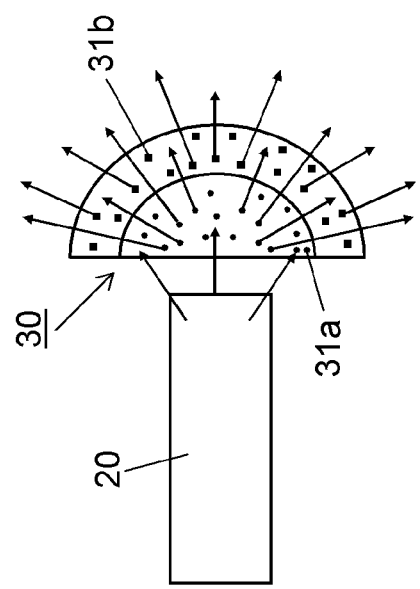
FIG. 18B is a diagram for describing a configuration of a wavelength conversion member of the conventional solid-state light source device.

In the above first, second, and sixth exemplary embodiments, an example is described in which base 152 is made of aluminum alloy material or the like; however, the base 152 may be configured as shown in FIG. 17. With reference to FIG. 17, first light reflecting layer 153A is provided between base 152 and first wavelength converter 151A, second light reflecting layer 153B is provided between base 152 and second wavelength converter 151B, and third light reflecting layer 153C is provided between base 152 and third wavelength converter 151C. With these configurations, a material for base 152 can be more freely selected. Note that, for first light reflecting layer 153A, second light reflecting layer 153B, and third light reflecting layer 153C, aluminum alloy material or the like is used.

The solid-state light source device of the present disclosure is useful as a way to restrain light from being reabsorbed in a phosphor of a wavelength converter and to reduce the number of light sources, and in particular, is useful for a light source for projection illumination use, a projector, and a headlight.

What is claimed is:

1. A solid-state light source device comprising:
   a semiconductor light emitting element;
   a wavelength conversion element; and
   a first lens,
   wherein the semiconductor light emitting element includes:
      a first light emitter; and
      a second light emitter,
   the wavelength conversion element includes:
      a first wavelength converter containing a first phosphor; and
      a second wavelength converter containing a second phosphor,
   the first wavelength converter and the second wavelength converter are disposed apart from each other,
   the first light emitter emits first excitation light, the second light emitter emits second excitation light,
the first phosphor converts the first excitation light into first-wavelength light,
the second phosphor converts the second excitation light into second-wavelength light,
the first lens is provided between the semiconductor light emitting element and the wavelength conversion element, and
the first excitation light, the second excitation light, the first-wavelength light and the second-wavelength light enter a pupil of the first lens, and
wherein the semiconductor light emitting element further includes a third light emitter,
the wavelength conversion element further includes a polarization converter,
the first wavelength converter, the second wavelength converter, and the polarization converter are disposed apart from each other,
the third light emitter emits third excitation light, and
the polarization converter changes a polarization state of the third excitation light to generate a fourth emitted light and emits the fourth emitted light.

2. The solid-state light source device of claim 1, wherein the wavelength conversion element includes a base,
the base has:
a first recessed portion; and
a second recessed portion,
the first wavelength converter is disposed in the first recessed portion, and
the second wavelength converter is disposed in the second recessed portion.

3. The solid-state light source device of claim 2, wherein a light reflecting layer is provided between the first wavelength converter and the first recessed portion.

4. The solid-state light source device of claim 1, wherein the semiconductor light emitting element further includes a third light emitter,
the wavelength conversion element further includes a third wavelength converter containing a third phosphor,
the first wavelength converter, the second wavelength converter, and the third wavelength converter are disposed apart from each other,
the third light emitter emits third excitation light, and
the third phosphor converts the third excitation light into third-wavelength light.

5. The solid-state light source device of claim 4, wherein the wavelength conversion element includes a base,
the base has:
a first recessed portion;
a second recessed portion; and
a third recessed portion,
the first wavelength converter is disposed in the first recessed portion,
the second wavelength converter is disposed in second recessed portion, and
the third wavelength converter is disposed in the third recessed portion.

6. The solid-state light source device of claim 4, wherein each of the first excitation light, the second excitation light, and the third excitation light has a peak wavelength in a near-ultraviolet region.

7. The solid-state light source device of claim 4, wherein the first-wavelength light has a peak wavelength in a range from 430 nm to 500 nm,
the second-wavelength light has a peak wavelength in a range of 500 nm to 600 nm, and
the third-wavelength light has a peak wavelength in a range from 550 nm to 700 nm.

8. The solid-state light source device of claim 1, wherein the first wavelength converter and the second wavelength converter are disposed in a single circle having a diameter of 4 mm or less.

9. The solid-state light source device of claim 1, wherein a dichroic mirror is provided between the semiconductor light emitting element and the wavelength conversion element, and
the dichroic mirror reflects the first-wavelength light and the second-wavelength light which have passed through the first lens.

10. The solid-state light source device of claim 1, wherein each of the first excitation light and the second excitation light has a peak wavelength in a near-ultraviolet region.

11. The solid-state light source device of claim 1, wherein the first-wavelength light has a peak wavelength in a range from 430 nm to 500 nm, and
the second-wavelength light has a peak wavelength in a range from 500 nm to 650 nm.

12. The solid-state light source device of claim 1, wherein the semiconductor light emitting element is a laser.

13. The solid-state light source device of claim 1, wherein the wavelength conversion element includes a rotation shaft.

14. The solid-state light source device of claim 1, wherein an outer shape of the first wavelength converter is included in a circle having a diameter of 1 mm.

15. The solid-state light source device of claim 1, wherein the wavelength conversion element includes a base,
the base has:
a first recessed portion;
a second recessed portion; and
a third recessed portion,
the first wavelength converter is disposed in the first recessed portion,
the second wavelength converter is disposed in the second recessed portion, and
the polarization converter is disposed in the third recessed portion.

16. A solid-state light source device comprising:
a semiconductor light emitting element; and
a wavelength conversion element,
wherein the semiconductor light emitting element includes:
a first light emitter; and
a second light emitter,
the wavelength conversion element includes:
a first wavelength converter containing a first phosphor; and
a second wavelength converter containing a second phosphor,
the first wavelength converter and the second wavelength converter are disposed apart from each other,
the first light emitter emits first excitation light,
the second light emitter emits second excitation light,
the first phosphor converts the first excitation light into first-wavelength light, and
the second phosphor converts the second excitation light into second-wavelength light,
the semiconductor light emitting element further includes a third light emitter,
the wavelength conversion element further includes a polarization converter,
the first wavelength converter, the second wavelength converter, and the polarization converter are disposed apart from each other, the third light emitter emits third excitation light, and the polarization converter changes a polarization state of the third excitation light to generate a fourth emitted light and emits the fourth emitted light.

17. The solid-state light source device of claim 16, wherein the wavelength conversion element includes a base, the base has:
- a first recessed portion;
- a second recessed portion; and
- a third recessed portion, the first wavelength converter is disposed in the first recessed portion, the second wavelength converter is disposed in the second recessed portion, and the polarization converter is disposed in the third recessed portion.

* * * * *